United States Patent
Huang et al.

(10) Patent No.: US 7,442,610 B2
(45) Date of Patent: Oct. 28, 2008

(54) LOW THERMAL BUDGET FABRICATION METHOD FOR A MASK READ ONLY MEMORY DEVICE

(75) Inventors: Shui-Chin Huang, Tainan (TW); Jen-Chuan Pan, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 10/156,323

(22) Filed: May 24, 2002

(65) Prior Publication Data

US 2003/0207539 A1   Nov. 6, 2003

(30) Foreign Application Priority Data

May 6, 2002  (TW) ............................... 91109317 A

(51) Int. Cl.
*H01L 21/8234*   (2006.01)
(52) U.S. Cl. ...................................... 438/275; 438/278

(58) Field of Classification Search ......... 438/275–278; 257/390, 391, 392, 393
See application file for complete search history.

(56) References Cited

U.S. PATENT DOCUMENTS

| 5,523,251 | A | * | 6/1996 | Hong | ............................ 438/278 |
| 5,672,532 | A | * | 9/1997 | Hsue et al. | ................... 438/278 |
| 5,854,109 | A | * | 12/1998 | Sheng et al. | ................. 438/275 |
| 5,977,601 | A | * | 11/1999 | Yang et al. | ................... 257/437 |
| 6,187,638 | B1 | * | 2/2001 | Wen | ............................ 438/278 |

* cited by examiner

*Primary Examiner*—Jack Chen
(74) *Attorney, Agent, or Firm*—J.C. Patents

(57) ABSTRACT

A low thermal budget fabrication method for a mask ROM is described. The method includes providing a substrate having a gate oxide layer thereon. A first conductive layer is formed on the gate oxide layer. A plurality of bit lines is formed in the substrate. A second conductive layer is then formed on the first conductive layer, followed by forming a plurality of ROM codes in the substrate.

24 Claims, 3 Drawing Sheets

LOW THERMAL BUDGET FABRICATION METHOD FOR A MASK READ ONLY MEMORY DEVICE

CROSS-REFERENCE TO RELATED APPLICATION

This application claims the priority benefit of Taiwan application serial no. 91109317, filed May 6, 2002.

BACKGROUND OF THE INVENTION

1. Field of the Invention

The present invention relates to a fabrication method for a mask ROM device. More particularly, the present invention relates to a low thermal budget fabrication method for a mask read only memory (ROM) device.

2. Background of the Invention

Mask ROM device is the most fundamental type of read only memory device. The conventional fabrication method for a mask ROM device includes forming a buried bit line, followed by forming a gate oxide layer and a gate layer, etc. However, the gate oxide layer is formed at a temperature of about 800 degrees Celsius. Lateral diffusion of dopants in the bit line thus easily occurs due to the thermal process. As the device dimension continues to scale down, lateral diffusion of dopants resulted from the thermal process generated in the forming of the gate oxide layer becomes more serious.

Therefore, a so-called post-gate oxide mask ROM fabrication method is currently being proposed, in which a gate oxide layer is first formed on a substrate. A gate layer is then formed on the gate oxide layer, followed by forming a silicon nitride layer as a hard mask layer. Thereafter, etching is performed to remove a portion of the silicon nitride layer and the gate layer. Ion implantation is further performed to form the buried bit line.

Although the aforementioned "post-gate oxide" fabrication method can prevent the various thermal process induced lateral diffusion problems, this type of fabrication method is much more complicated than the conventional approach, greatly increasing the production cost and the processing time.

SUMMARY OF THE INVENTION

Accordingly, the present invention provides a low thermal budget fabrication method for a mask ROM, wherein the thermal process induced lateral diffusion of the bit line is mitigated.

The present invention also provides a low thermal budget fabrication method for a mask ROM, wherein the fabrication of a mask ROM is simplified.

The present invention further provides a low thermal budget fabrication method for a mask ROM device, wherein the device window is significantly increased.

Accordingly, the present invention provides a low budget fabrication method for a mask ROM device. The method provides forming a gate oxide layer on a substrate, followed by forming a conductive layer on the gate oxide layer. A plurality of bit lines is then formed in the substrate. A second conductive layer is then formed on the first conductive layer, wherein the second conductive layer is apparently thicker than the first conductive layer. A plurality of ROM codes is subsequently formed in the substrate.

The present invention further provides a low thermal budget fabrication method for a mask ROM device. A gate oxide layer is formed on a substrate, followed by forming a first conductive layer on the gate oxide layer. Further using an ion implantation process to form a plurality of bit lines in the substrate. Thereafter, a second conductive layer is formed on the first conductive layer, followed by forming a metal silicide on the second conductive layer. Subsequently, a plurality of ROM codes is formed in the substrate by ion implantation.

Since in the present invention, the gate oxide layer is formed, followed by forming the bit line by ion implantation, the thermal budget is lower. The problem of lateral diffusion during the formation of the gate oxide layer because the bit line is first formed as in the prior art is prevented.

Moreover, subsequent to the formation of the gate oxide layer, a thinner first conductive layer is then formed on the gate oxide layer. The gate oxide layer is thereby protected from being contaminated by the photoresist layer.

Subsequent to the formation of the thinner first conductive layer according to the present invention, a photoresist layer is used as a mask for the ion implantation process to form the bit line. A second conductive layer is then formed to complete the gate oxide layer. The present invention is much simpler than the "post-gate oxide" fabrication method.

Further, the present invention can prevent the bit line lateral diffusion. A greater memory device window is resulted, which is favorable in the development of further scaling down devices.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A-1F are schematic, cross-sectional views illustrating the process flow of a low thermal budget manufacturing method for a mask ROM device.

Figure 1A:
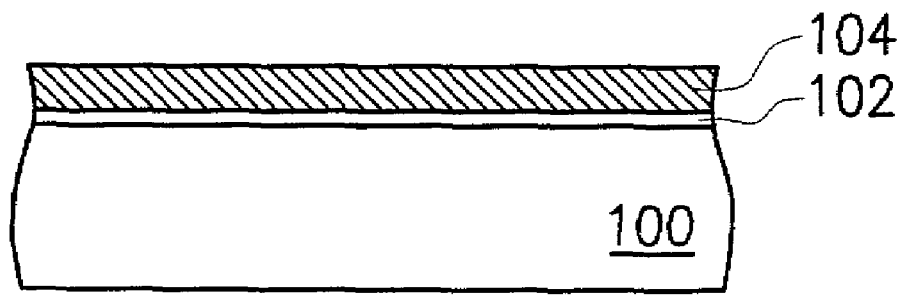
FIGS. 1A-1F are schematic, cross-sectional views illustrating the process flow of a low thermal budget manufacturing method for a mask ROM device.

Referring to FIG. 1A, a gate oxide layer 102 is formed on a substrate 100, wherein the gate oxide layer 102 is about 30 angstroms thick. A first conductive layer 104 is then formed on the gate oxide layer 102, wherein the first conductive layer 104 is about 50 to 200 angstroms thick. A material used for the first conductive layer 104 includes polysilicon.

Figure 1B:
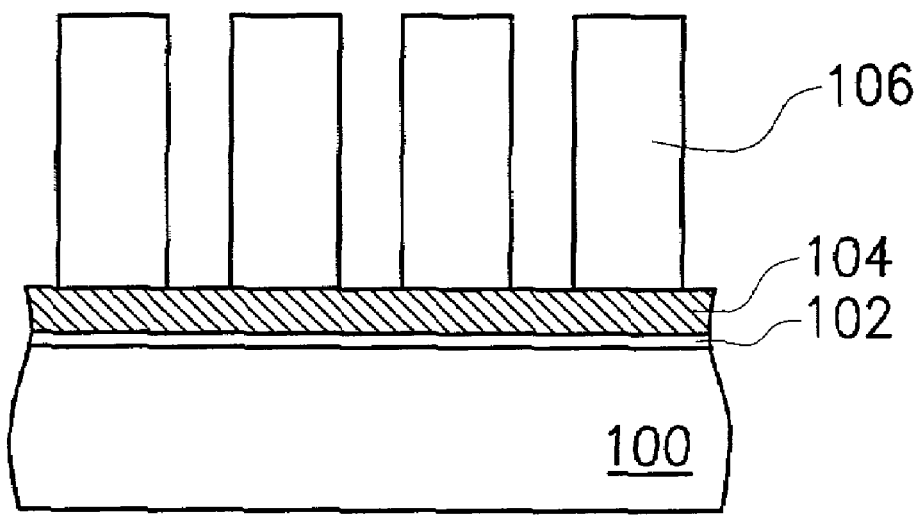

Referring to FIG. 1B, a patterned photoresist layer 106 is then formed on the substrate 100. The patterned photoresist layer 106 exposes a portion of the first conductive layer 104. Further, before forming the photoresist layer 106, a bottom anti-reflection coating (BARC) layer may form on the first conductive layer 104.

Figure 1C:
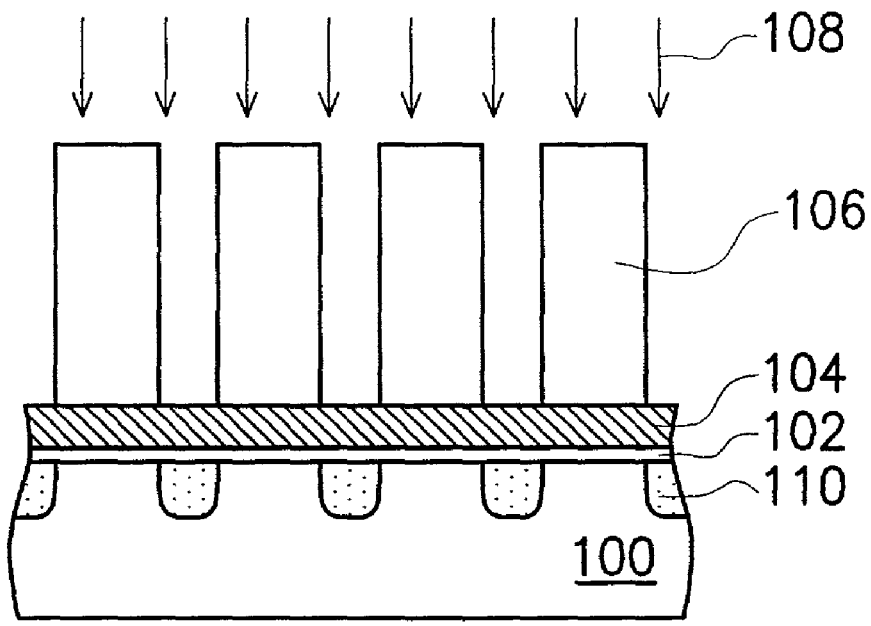

Continuing to FIG. 1C, a buried bit line ion implantation process 108 is performed to form a buried bit line 110 in the substrate 100, wherein the implanted dopants include arsenic and the implantation energy for the implantation process 108 is about 40 keV to about 100 keV.

Figure 1D:
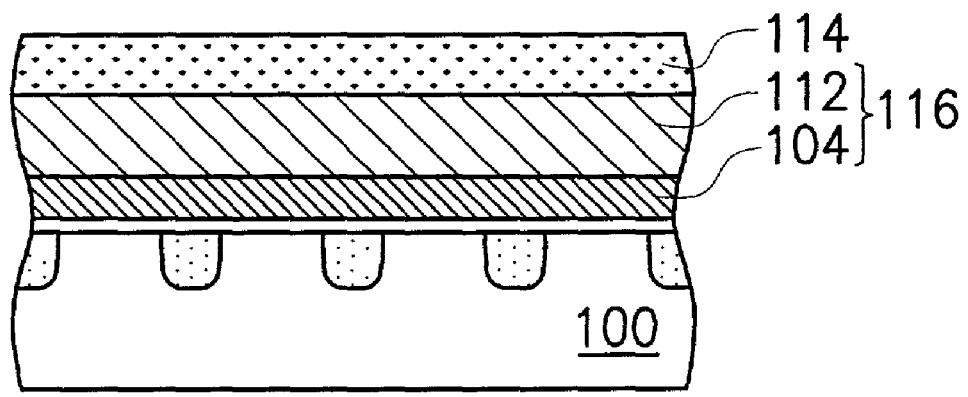

As shown in FIG. 1D, the photoresist layer 106 is removed. A second conductive layer 112 is then formed on the first conductive layer 104. A gate layer 116 is thereby formed with the first conductive layer 104 and the second conductive layer 112. The second conductive layer 112 is about 400 angstroms to about 700 angstroms thick, and is made of a material, such as, polyslilicon. Before forming the second conductive layer 112, a pre-clean process may perform to clean the surface of the first conductive layer 104. Thereafter, a metal silicide layer 114 is formed on the second conductive layer 112, wherein the metal silicide layer 114 is about 750 angstroms to 1500 angstroms thick. The metal silicide layer 114 is formed with a material, such as, tungsten silicide.

Figure 1E:
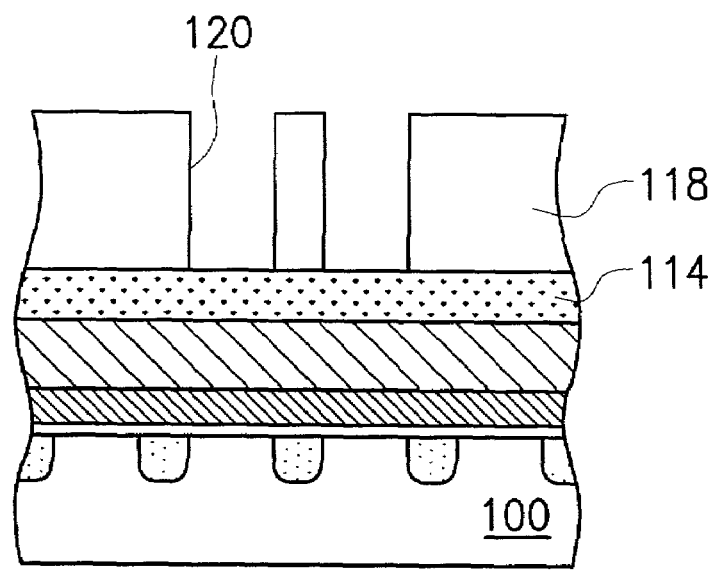

Continuing to FIG. 1E, a photoresist layer 118 that comprises an opening 120 is formed on the substrate 100. Before the formation of the photoresist layer 118, a bottom anti-reflection coating layer (not shown in Figure) may be formed on the metal silicide layer 114.

Figure 1F:
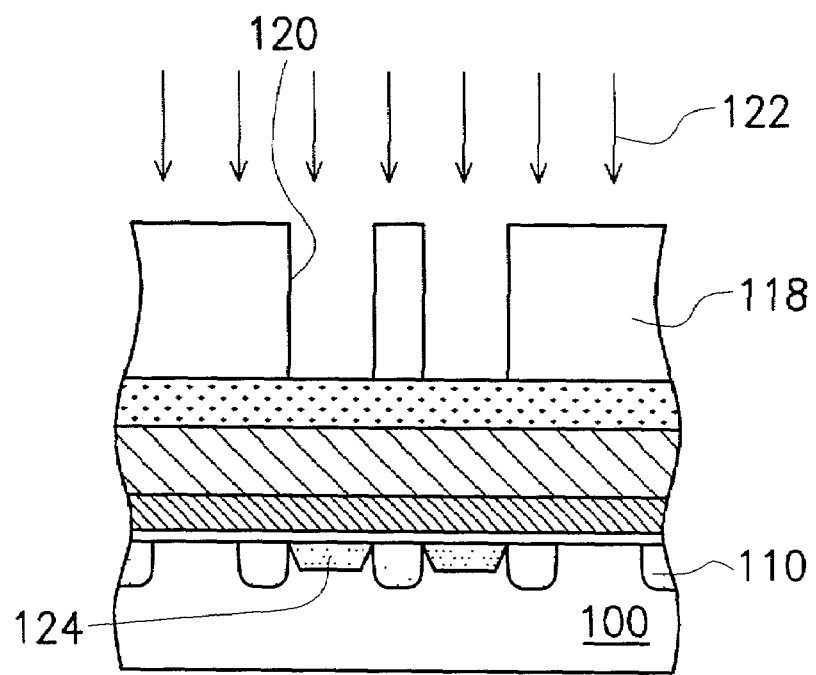

Thereafter, as shown in FIG. 1F, a ROM coding implantation process 122 is performed to form the memory code 124 doped region in the substrate 100. The implanted dopants include boron and the implantation energy for the implantation process 122 is about 40 keV to 100 keV.

According to the present invention, the gate oxide layer is formed followed by forming the bit line by ion implantation. The problem of bit line lateral diffusion due to the thermal process generated during the formation of the gate oxide layer in the conventional practice is mitigated.

Further, subsequent to the formation of the gate oxide layer in the present invention, a thinner first conductive layer is formed. The gate oxide layer is thereby protected from being contaminated.

Further, according to the present invention, the gate oxide layer is formed followed by forming a thinner first conductive layer, then a bit line and then a second conductive layer to complete the formation of the gate layer. The present invention can thus omit the application of a hard mask as in the post-gate oxide process to achieve the low thermal budget purpose. The manufacturing process is thus simplified.

According to the present invention, the gate oxide layer is formed before the bit line formation. Lateral diffusion of the bit line is thus prevented to create a larger memory cell device window and to enhance the development of miniaturizing devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A low thermal budget fabrication method for a mask ROM device, the method comprising:
   providing a substrate that already comprises a gate oxide layer;
   forming a blanket first conductive layer on the gate oxide layer;
   forming a plurality of bit lines in the substrate by implanting ions through the gate oxide layer and a portion of the blanket first conductive layer;
   forming a second conductive layer directly on the blanket first conductive layer without patterning the blanket first conductive layer, so that the second conductive layer is in direct contact with the blanket first conductive layer and completely separated from the gate oxide layer by the blanket first conductive layer; and
   forming a plurality of ROM codes in the substrate.

2. The method of claim 1, wherein forming the first conductive layer includes forming a polysilicon layer.

3. The method of claim 1, wherein forming the bit lines in the substrate further comprises:
   forming a patterned photoresist layer on the first conductive layer;
   performing an ion implantation process; and
   removing the patterned photoresist layer.

4. The method of claim 3, wherein dopants implanted in the ion implantation process comprises arsenic ions.

5. The method of claim 1, wherein forming the second conductive layer includes forming a polysilicon layer.

6. The method of claim 1, wherein the second conductive layer is formed thicker than the first conductive layer.

7. The method of claim 1, wherein a metal silicide layer is further formed on the second conductive layer.

8. The method of claim 7, wherein forming the metal silicide layer includes forming a tungsten silicide layer.

9. The method of claim 1, wherein forming the ROM codes in the substrate further comprises:
   forming a patterned photoresist layer on the second conductive layer;
   performing an ion implantation process; and
   removing the patterned photoresist layer.

10. The method of claim 9, wherein dopants implanted for the ion implantation process comprises boron ions.

11. The method of claim 1, wherein the first conductive layer is formed with a thickness of about 50 angstroms to about 200 angstroms.

12. The method of claim 1, wherein the second conductive layer is about 400 angstroms to about 700 angstroms thick.

13. The method of claim 7, wherein the metal silicide layer is about 750 angstroms to about 1500 angstroms thick.

14. A low thermal budget fabrication method for a mask ROM, comprising:
   providing a substrate having a gate oxide layer thereon;
   forming a blanket first conductive layer on the gate oxide layer;
   forming a plurality of bit lines in the substrate by implanting ions to at least a region of the substrate through a portion of the blanket first conductive layer; and
   forming a second conductive layer directly on the blanket first conductive layer without patterning the blanket first conductive layer, so that the second conductive layer is in directly contact with the blanket first conductive layer and completely separated from the gate oxide layer by the blanket first conductive layer.

15. The method of claim 14, wherein forming the first conductive layer includes forming a polysilicon layer.

16. The method of claim 14, wherein forming the bit lines in the substrate further comprises:
   forming a patterned photoresist layer on the first conductive layer;
   performing an ion implantation process; and
   removing the patterned photoresist layer.

17. The method of claim 16, wherein dopants implanted for the ion implantation process comprises arsenic ions.

18. The method of claim 14, wherein forming the second conductive layer includes forming a polysilicon layer.

19. The method of claim 14, wherein the second conductive layer is formed thicker than the first conductive layer.

20. The method of claim 14, wherein a metal silicide layer is further formed on the second conductive layer.

21. The method of claim 20, wherein forming the metal silicide layer includes forming a tungsten silicide layer.

22. The method of claim 14, wherein the first conductive layer is formed with a thickness of about 50 angstroms to about 200 angstroms.

23. The method of claim 14, wherein the second conductive layer is about 400 angstroms to about 700 angstroms thick.

24. The method of claim 20, wherein the metal silicide layer is about 750 angstroms to about 150 angstroms thick.

* * * * *